United States Patent
Grosso et al.

(10) Patent No.: US 7,239,258 B2
(45) Date of Patent: Jul. 3, 2007

(54) ENHANCEMENT OF THE DYNAMIC RANGE OF A MULTIBIT DIGITAL-TO-ANALOG CONVERTER

(75) Inventors: Antonio Grosso, Torrevecchia Pia (IT); Cristiano Meroni, Milan (IT); Edoardo Botti, Vigevano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/352,104

(22) Filed: Feb. 10, 2006

(65) Prior Publication Data

US 2006/0176203 A1  Aug. 10, 2006

(30) Foreign Application Priority Data

Feb. 10, 2005  (EP) .................. 05425062

(51) Int. Cl.
*H03M 1/62* (2006.01)
(52) U.S. Cl. ..................... 341/139; 341/144
(58) Field of Classification Search ................ 341/143, 341/144, 152, 120, 139
See application file for complete search history.

(56) References Cited

U.S. PATENT DOCUMENTS 5,864,311 A    1/1999  Johnson et al. ............. 341/155
5,960,092 A *  9/1999  Lai ............................. 381/104
6,417,793 B1* 7/2002  Bugeja et al. ............... 341/144
6,927,715 B2* 8/2005  Chang et al. ................ 341/143

OTHER PUBLICATIONS

Enami Kazumi; "D/A Conversion Processing", Patent Abstracts of Japan, Publication No. 06069741 published Mar. 11, 1994, vol. 18, No. 318.
Hashimoto Tadao, "Dynamic Range Extending Device", Patent Abstracts of Japan, Publication No. 07254832, published Oct. 3, 1005, vol. 1996, No. 02.

\* cited by examiner

*Primary Examiner*—Brian Young
(74) *Attorney, Agent, or Firm*—Lisa K. Jorgenson; Allen, Dyer, Doppelt, Milbrath & Gilchrist, P.A.

(57) ABSTRACT

A digital-to-analog converter (DAC) for an audio system may include at least first and second subsets of individually selectable elementary current sources for delivering analog output current contributions, a code conversion circuit for selecting elementary current sources of first and second subsets as a function of codes of a pulse code modulated (PCM) input signal. The DAC may multiply by a certain factor incoming codes of the PCM signal after their value has remained lower than a threshold for a certain period of time and for as long as their value equals or surpasses the threshold value, and may correspondingly scale and de-scale by the same factor the amplitude of the analog output current contributions produced by the elementary current sources of the two subsets.

16 Claims, 4 Drawing Sheets

ENHANCEMENT OF THE DYNAMIC RANGE OF A MULTIBIT DIGITAL-TO-ANALOG CONVERTER

FIELD OF THE INVENTION

The present invention relates to a method for enhancing the dynamic range of a multibit digital-to-analog converter (briefly DAC), particularly useful, though not exclusively, for audio applications.

BACKGROUND OF THE INVENTION

Digital-to-analog conversion for audio applications is performed by generating the output analog signal as the sum, at each sampling instant, of a given number of elementary quantities or contributions, which may be, for example, currents supplied by elementary current generators or generated by means of resistors, or charges stored in capacitors. Digital-to-analog conversion can be roughly divided in two major categories according to the approach adopted in the conversion namely either "thermometric" or "binary" coding.

In thermometric coding, the elementary contributions used for generating the output analog signal assume values identical to one another and are generated by distinct sources numbering N, where $N=2^n$ represents the number of levels of the output analog signal for a number of bits equal to n. Optionally, in order to obtain a balanced output analog signal, i.e., an output signal of zero mean value, able to assume either positive values or negative values that are symmetrical with respect to zero, half (N/2) of the elementary sources may be designed for supplying positive elementary contributions and the other half of the sources for supplying negative elementary contributions to the output analog signal, and the value of each elementary contribution is $2A_{MAX}/2^n$, where $A_{MAX}$ represents the maximum amplitude, either positive or negative, that the output analog signal should assume.

Differently, in binary coding, the number of distinct sources to be implemented for providing the elementary contributions is equal to the number of bits n of the digital-to-analog converter that is equal to $n=\log_2 N$. The dimensions of the integrated elementary sources (for example current generators) are not identical but appropriately graded in such a way that the elementary contributions thereby produced are submultiples of a power of 2 with respect to the maximum value $A_{MAX}$, in which the least significant bit (LSB) has a weight of $2A_{MAX}/2^n$, whilst the most significant bit (MSB) has a weight of $A_{MAX}$.

Usually, the numerical processing part of an audio DAC that precedes the analog output part, includes a numerical interpolator, followed by a noise shaping circuit, for the overall purpose of reducing the number of bits with which the digital PCM input signal is encoded, without worsening the quality in terms of in-band noise level.

More specifically, to maintain a high audio fidelity, the numerical interpolator performs an oversampling of the PCM signal, that is it increases the sampling frequency by a certain factor. This technique makes possible a reduction of the density in frequency of all spurious spectral components, eliminating undesired spectral repetitions.

The interpolation is followed by a noise-shaping operation including numerically differentiating the signal transfer function and the requantization error transfer function. By doing so, the input signal is transferred from the input to the output of the noise shaping circuit unaltered while the requantization error is subject instead to a transfer function typical of a high-pass filter, having a modulus smaller than one within the audio band and greater than one outside the audio band. The effect is of markedly increasing the precision even in presence of a quantizer with a very limited number of bits, even just one bit.

The numerical processing part of the digital-to-analog converter is then followed by a code conversion circuit that may be thought as representing (eventually in association to a scrambling circuit) the boundary between the digital and the analog domains of the converter. The code conversion circuit practically points to (selects) the elementary contributions to the analog output signal as a function of the digital code at its input.

Often, depending on the type of coding used, different techniques of dynamic element matching (DEM) may be optionally implemented to de-correlate the errors introduced by mismatchings among the graded current generators, in case of binary coding, or among the identical current generators, in the case of thermometric coding.

Numerous DEM techniques have been proposed for compensating the non-linearity of a DAC, the simplest being known in literature as "Randomization" or "Scrambling". Accordingly, the elementary sources to be activated for producing respective contributions to the analog signal output by the DAC at every sampling period are chosen altogether at random among those available for selection, thus determining a variable error even in presence of a constant input value. On this basic approach, many more effective techniques have been developed.

Published U.S. Patent Application 2000/0063648A1, provides a review of numerous of these DEM techniques and discloses a method of dynamic matching of the elements of a multibit DAC with balanced output of audio applications.

Overall, the dynamic range remains a fundamental parameter of a digital to analog converter, representing the measure of the noise characteristic of the DAC circuit.

Typically, for an audio DAC, a −60 dB FS digital sine waveform is applied at the input and the ratio between the amplitude of the analog sine waveform reproduced at the output of the DAC and the amplitude of the residual noise plus the harmonics of the signal caused by the distortion introduced by the DAC plus 60 dB defines the dynamic range parameter (briefly DR), that is $$DR=20*LOG(V_{signal}/V_{(noise+distorsion)})+60 \text{ dB}.$$

On another account, till recently the volume control was usually implemented in the analog part of the audio signal processing chain with traditional analog circuit components, that is downstream of the DAC in the signal path. It is more and more preferred by manufacturers of audio equipment, to implement the volume control in the digital domain, because of the augmented versatility to implement sophisticated automatic control and because of overall fabrication simplification, by no longer requiring external circuit components for analog volume control. Moreover, the elimination of an analog volume control makes possible the realization of the last functional blocks of a typical audio system, that is the audio DAC interface and the output power amplifier, on a single chip.

However, the choice of implementing the volume control in the digital signal processing part of the audio system, upstream of the DAC interface of the output power amplifier, has trade offs. Notably, the noise and distortion that are produced in the DAC are no longer attenuated by the analog volume control. In practice, in case of such "fully" digital systems, the output noise and distortion are generally higher than that of a comparable traditional system with analog volume control operating downstream of the DAC.

A measure of such a difference of output noise level for two comparable audio systems, 1) and 2), is illustrated in FIG. 1. The relatively higher output noise level of a system implementing a digital volume control in the digital signal processing portion of the chain of functional blocks of the system reduces proportionally the dynamic range.

SUMMARY OF THE INVENTION

An effective method is provided of enhancing the dynamic range of operation of a digital-to-analog converter (DAC) of an audio system at relatively low input signal levels that can be easily and economically implemented.

As a result, even the above discussed drawback of the often preferred design choice of implementing the volume control in the digital signal processing section, upstream of the DAC along the signal path, may be effectively recovered.

The method of this invention is based on the principle of the compressor/expander (briefly "compander") for reducing the relative weight of the noise content, at relatively small input signal amplitudes, that is under conditions of operation that could lead to a sensible reduction of the dynamic range. The way the compression/expansion is actuated may ensure that the dynamic range of the analog signal output by the DAC may reach the fullest amplitude without athe introduction of artifacts like pops, clicks, pumping effects, and the like.

For example, the method may be implemented in a current-mode multibit sigma-delta DAC of the thermometric code conversion type as the one amply described in the already cited prior Published U.S. Patent Application U.S. 2002/0063648 A1, and more generally to any DAC, used in an audio system.

The compression/expansion noise and distortion curbing technique may seamlessly complement, at critically low levels of the input signal, other techniques such as the above discussed noise shaping technique and DEM algorithms implemented for de-correlating the errors that are introduced because of mismatchings among the elementary contribution sources (current generators) employed for the digital-to-analog conversion.

Basically, the method includes multiplying by a certain factor the incoming digital codes of the pulse code modulated signal, after their value has remained lower than a predefined threshold value for a certain period of time or number of sampling periods, and in correspondingly scaling by the same factor the amplitude of the elementary output current contributions delivered by the selectable elementary sources of the converter. Of course the process is reversed when the value of a single one or of several successive digital codes of the signal surpasses the same threshold value or a different pre-established threshold value, practically stopping the expansion/compression action when the signal level rises again above the relative threshold.

This is implemented by introducing an additional relatively simple logic circuit for monitoring the incoming sampled codes of the input signal and if their value remains lower than a certain threshold for a certain period of time (or number of successive sampling periods), the logic circuit enables, through a first signal, the multiplication of the logic code (the digital samples of the pulse code modulated input signal) by a certain factor, within the numerical processing part of the DAC, and, coordinately, the logic circuit commands the scaling by the same factor of the amplitude of the current contributions produced by the elementary sources.

Besides enabling the multiplication by a certain factor of the input signal numerical codes, the logic circuit checks the pointing indexes generated by the code conversion circuit of the DAC to render unavailable for scaling a subset of elementary sources of the DAC that should not be subject to scaling during the current sampling period, while being used for the digital-to-analog conversion. The deselected subset of elementary sources will undergo scaling during the successive sampling period when the elementary sources belonging to the subset that was scaled during the preceding sampling period will be addressed for the conversion.

Preferably every time the expansion/compression function is activated or deactivated, all the elementary current sources of the DAC are scaled or de-scaled by the predefined factor, coordinately with the enabling or disabling of the multiplication function, within just two sampling periods, thus without having any noticeable effect on the relatively low-frequency audio signal produced at the output of the DAC. Moreover, the coordination of the functions prevents the introduction of any artifact.

By virtue of the fact that the digital signal is simultaneously amplified by the same factor, a dynamic range enhancement of a measure equal to the factor is obtained at the output of the DAC. The analog signal will practically have the same amplitude while the noise level introduced by the DAC will be significantly reduced.

BRIEF DESCRIPTION OF THE DRAWINGS

The features and advantages of this invention will become even more evident through the following description of an embodiment and by referring to the attached drawings, wherein.

DETAILED DESCRIPTION OF THE PREFERRED EMBODIMENTS

Figure 1:
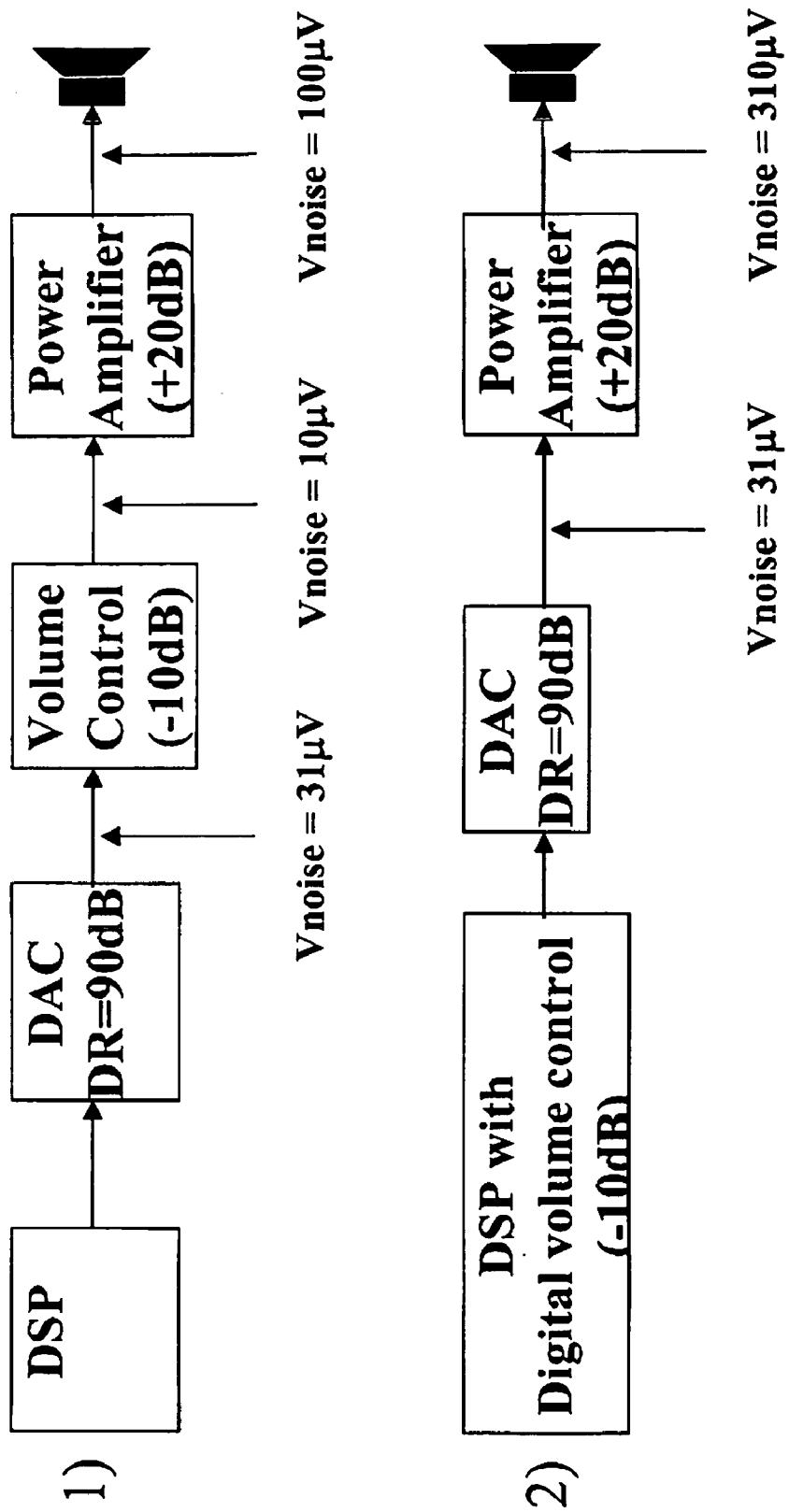
FIG. 1 shows, as discussed above, a comparison of two equivalent audio systems with analog volume control and with a digital volume control as in the prior art.
Figure 2:
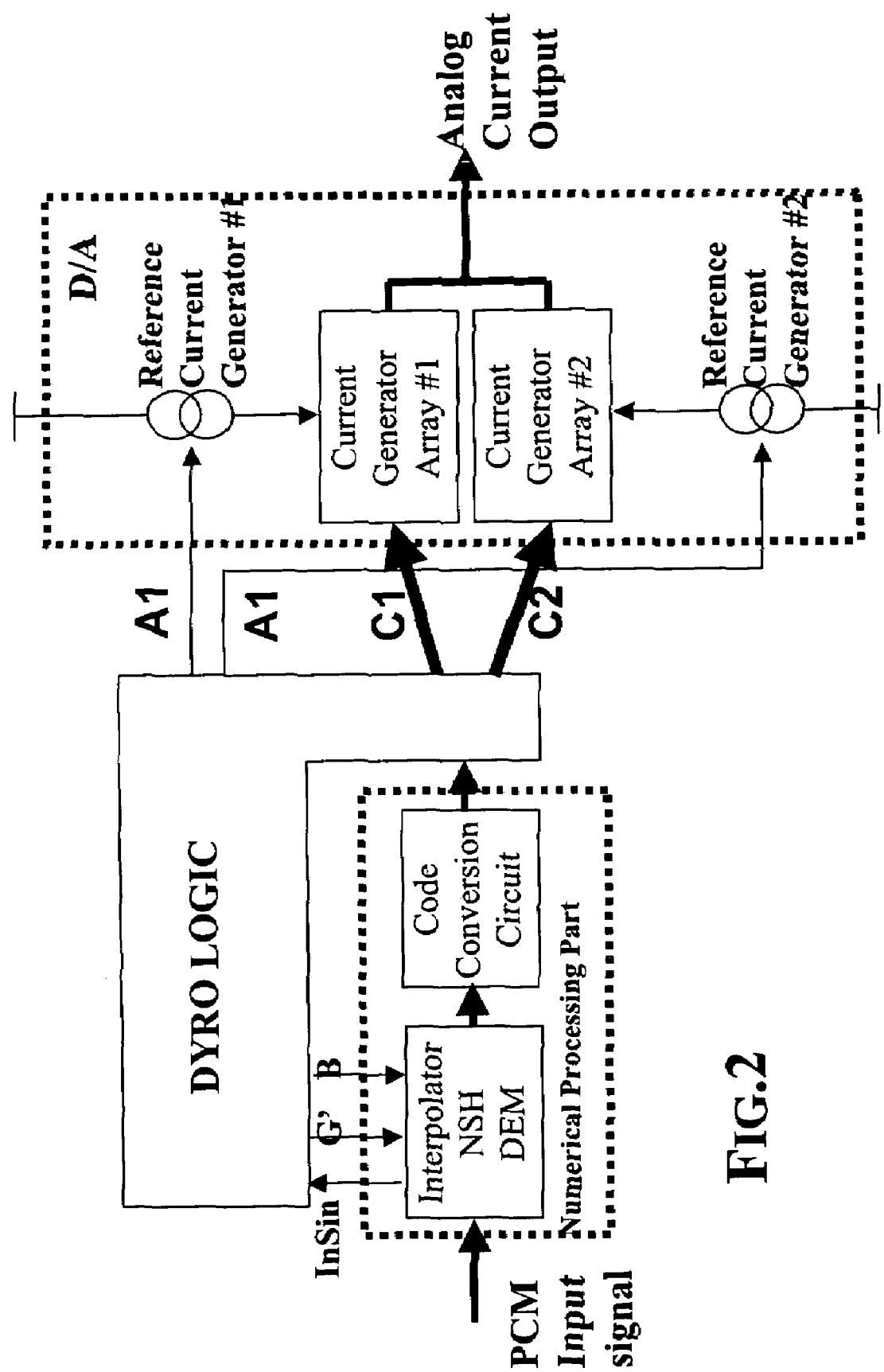
FIG. 2 is a basic diagram of a DAC provided with the dynamic range of enhancement according to this invention for an exemplary embodiment of an audio system.

FIG. 2 is a representation of a digital-to-analog converter, detailing the numerical processing part and the analog output part, D/A, respectively identified by the two distinct dotted line perimeters, and of the additional logic circuit, DYRO LOGIC, implementing this invention. The digital-to-analog converter of FIG. 2 may include the DAC "interface" between the "DSP with Digital Volume Control" and the "Power Amplifier" of an audio system, according to the relevant part (2) of FIG. 1.

Solely for illustration purposes, the DAC will be considered to be of the so-called thermometric code conversion type, employing N elementary current sources individually selectable and, in the example considered, organized in two subsets, namely: Array#1 and Array#2, each including N/2 elementary current generators, nominally identical to one another.

The block DYRO LOGIC comprises a logic circuit for monitoring the value of the sampled numerical codes of the pulse code modulated signal and comparing it with a certain threshold value for generating an input code multiplication command signal, G' and eventually even a second multiplication command signal B as will be described in detail later, as a function of the monitored values of the PCM signal. If the value of the incoming samples remains lower than the threshold value for a certain interval of time (i.e. number of successive sampling periods), the signal G' eventually commands the multiplication of the code value by a certain factor and, coordinately, the current scaling by the same factor of the amplitude of the current contributions provided by the selectable elementary current generators of the DAC.

Figure 3:
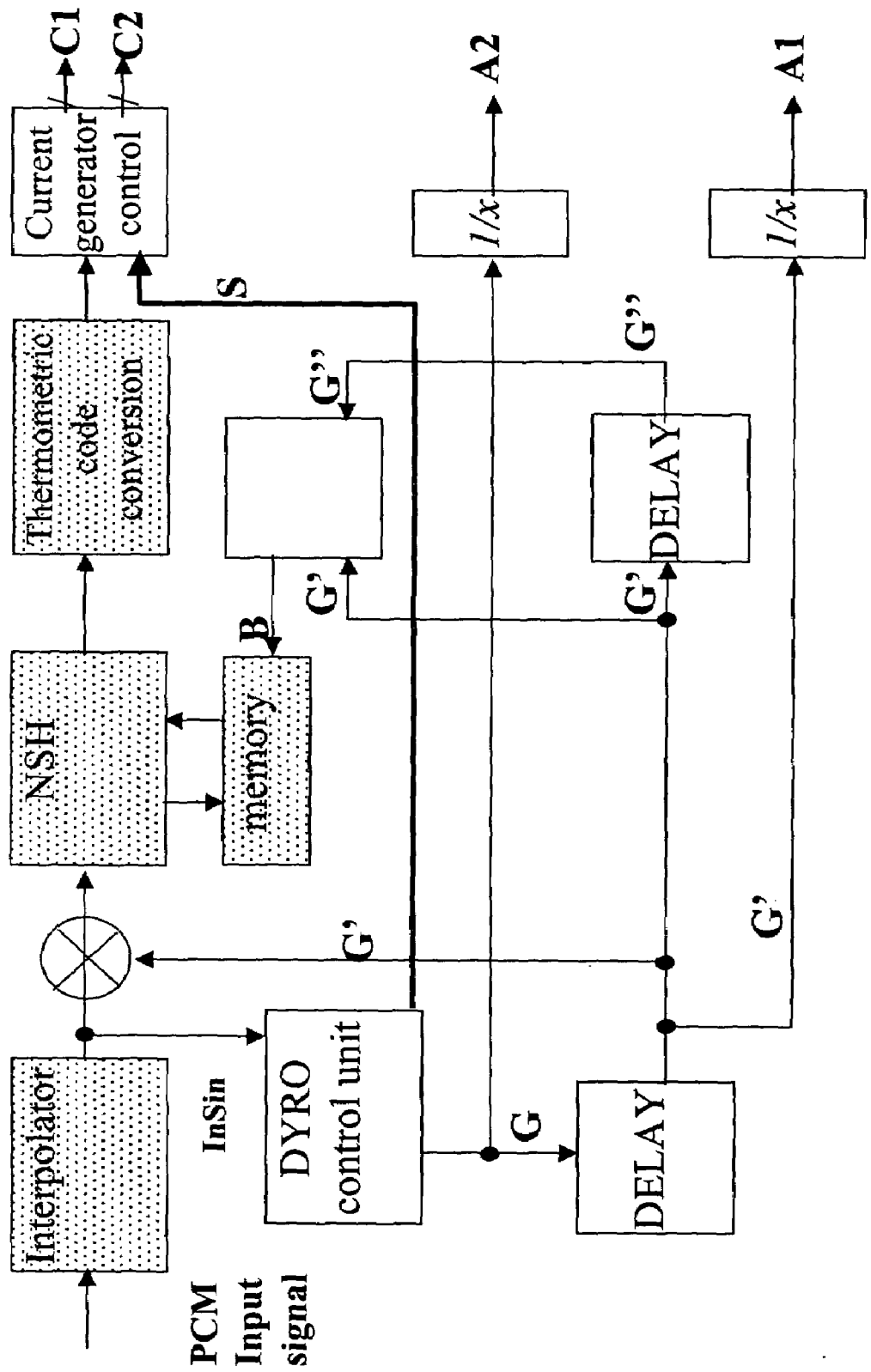
FIG. 3 is a detailed block diagram of the numerical processing part of the DAC and of the added logic circuit for implementing the method of this invention, showing the interconnections with the functional blocks of the exemplary DAC of FIG. 2.

In the embodiment shown in FIG. 2, the scaling of the amplitude of the elementary current contributions may be implemented by adjusting respective reference current generators #1 and #2 of the two subsets, Array#1 and Array#2, of elementary current generators. The manner in which the coordinate adaptation to the input value multiplication function through a corresponding scaling of the amplitudes of the single contributions to the analog output by the elementary current generators selectable by the code conversion circuit of the DAC and, if necessary, of other numerical processes that may be carried out in the numerical processing part of a particular audio DAC, will be better illustrated by referring to the detailed block diagram of FIG. 3. In FIG. 3 are shown the interconnections of the added logic circuit for implementing the method, with certain functional blocks (shown by the darkened blocks) that may be included in the numerical processing part of a common audio DAC as the one here considered.

In case the DAC includes, as shown in the detail diagram of FIG. 3, an interpolator of the PCM input signal, for the purposes already discussed above, it should be accounted for the fact that the interpolator introduces a delay that could be difficult to match. Therefore, the monitoring of the signal level by the DYRO CONTROL UNIT may be preferably done on the interpolated signal INSIN. Depending on the result of the comparison with the set threshold value, the DYRO CONTROL UNIT generates a correspondent command signal G.

Each one of the two delay circuits, DELAY, introduces a propagation delay of the value G produced by the DYRO CONTROL UNIT, equal to one sampling period. At the start of a sampling period ($t_1$) following the one ($t_0$) in which the DYRO CONTROL UNIT has produced an input multiplication command G, the delayed replica G' commands the multiplication by a certain factor (x) of the incoming new sampled numerical codes.

In the sample embodiment shown, the so multiplied numerical incoming codes are processed through the noise shaping circuit NSH of the DAC, using continuously updated error values that are dynamically stored in a work memory of the noise shaping circuit. Therefore, the error values stored in the work memory are coordinately multiplied by the same factor (x) to preserve the effectiveness of the noise shaping circuit and permit the introduction of artifacts. As shown, this may be accomplished by inputting to the work memory of the noise shaping circuit NSH, a multiplication command B for multiplying by the same factor (x) the error values stored in the work memory.

Practically the command B may be generated every time the gain value (G') at the sampling period ($t_1$) and the gain value (G") during the preceding sampling periods ($t_{-1}$) and ($t_0$) are different from each other and may correspond to the ratio between the two different gain values expressed or commanded by the commands G' and G" at the respective sampling periods.

In the embodiment shown in FIG. 3, is contemplated the possible presence, within the DAC, of a scrambling circuit CURRENT GENERATOR CONTROL, for eventually actuating a certain DEM algorithm of de-correlation of errors due to mismatching among elementary sources by choosing them altogether at random among those available for selection, as established by the THERMOMETRIC CODE CONVERSION block. Commonly, a scrambling algorithm generates at random an index i that points (select) a certain first elementary source and, depending on the converted analog level, a corresponding number j of contributory sources, adjacent to a first one pointed by the randomly generated index i will be active, during the sampling period, in delivering elementary current contribution to the output signal of the DAC.

In any case, where not already contemplated because of the design choice of producing a balanced output signal, symmetrical about the zero, either a scrambling circuit CURRENT GENERATOR CONTROL block that actuates a certain DEM algorithm or a selection conditioning circuit purposely included within the DYRO LOGIC block of FIG. 2, defines two subsets of the N elementary sources of the DAC (for example by forcing, during a certain sampling period, either a "0" value or a value N/2−1 of the index i, that normally is generated at random, as discussed above).

Either through a selection conditioning command S to a scrambling circuit CURRENT GENERATOR CONTROL implementing a certain DEM algorithm of the DAC, as shown in the diagram of FIG. 3, or through a similarly controllable dedicated selection conditioning circuit of the DYRO LOGIC block of FIG. 2, whenever the "compander" function is to be activated or deactivated, the elementary sources of the two subsets are made alternately available to selection for contributing to the analog output signal, at two successive sampling periods.

It should be remarked that both activation and deactivation of the "compander" function are events that take place under conditions of relatively low signal dynamics (crossing of the relative threshold). This means that a relatively small number j of the N elementary sources will be selected to contribute to the analog output of relatively low level, and therefore there will be a relatively large number of deselected sources, amply accommodating a conditionally deselected subset of sources to be scaled while not contributing to the output analog signal, during a sampling period.

Figure 4:
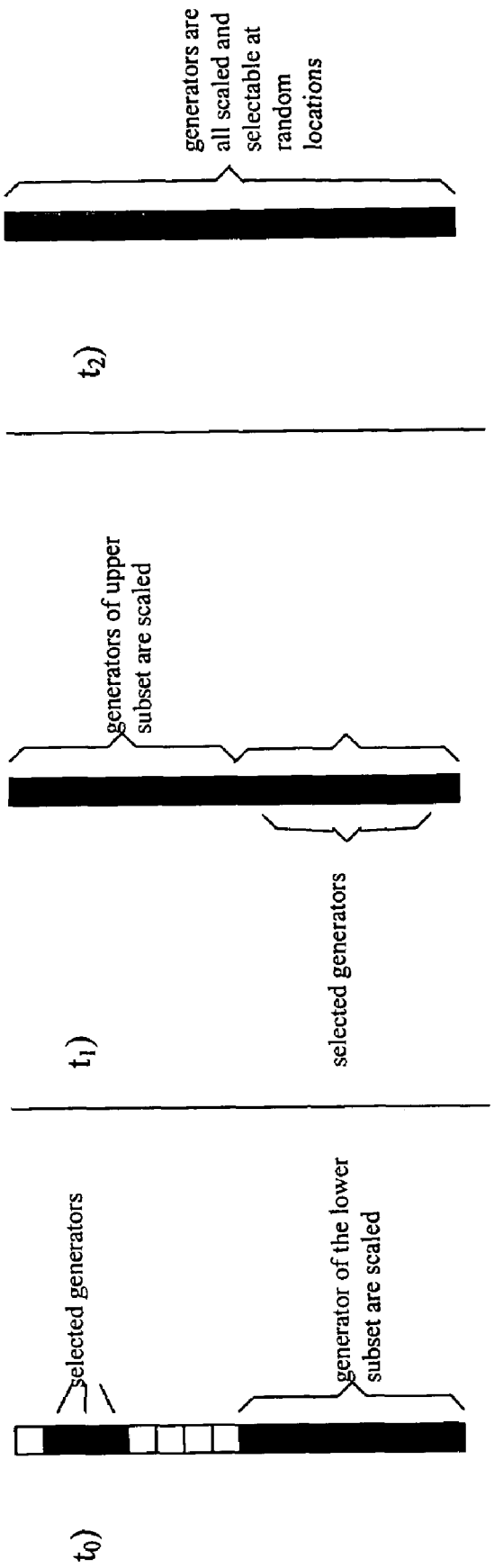
FIG. 4 is a schematic diagram of the logic selection of subsets of elementary current generators of the digital-to-analog converter to be scaled (or de-scaled) in two successive sampling periods when activating (or deactivating) the expansion/compression function, according to a sample embodiment of this invention.

FIG. 4 is a schematic illustration of how an effective coordinated scaling of the elementary analog output contributions by the same factor of multiplication of the numerical signal codes is performed in just two sampling periods, without affecting the elementary current generators that are being used, during the current sampling period, for digital to analog conversion, that is without including in a scaling step the elementary current generators being, for that sampling period, selected for the digital to analog conversion.

In the diagrams of FIG. 4, a whole set of sixteen elementary sources ($N=2^n$) of a four bit DAC, are schematically arranged to provide a one dimensional vector, commonly swept by an index i for individually addressing a first elementary current generator of the j adjacent generators, selected by the code conversion circuit for contributing, in the current sampling period, a total of j elementary currents to the analog output signal of the DAC.

The sixteen elementary current generators are considered to belong to two distinct subsets including the upper elementary eight current generators and by the lower eight elementary current generators, respectively.

By referring to the circuit embodiment of FIG. 3, the DAC is assumed to have been working up to sampling period $t_{-1}$, with a normal signal dynamics, at normal gain conditions, with the scrambling circuit CURRENT GENERATOR CONTROL working normally in implementing a certain DEM algorithm. This is until the DYRO CONTROL UNIT, at the start of the sampling period $t_0$, activates the multiplication command G and the selection conditioning signal S forces the pointing index i, within the scrambling circuit CURRENT GENERATOR CONTROL, to "0" thus forcing the selection through the bus C1 of FIG. 3, of j generators as commanded by the thermometric code conversion circuit among those of the upper subset, as depicted in the left side array of FIG. 4.

During the same sampling period $t_0$, all eight elementary current generators of the lower subset are scaled by the pre-defined factor 1/x of the "compander" function, for example by ½ (the current contribution they produce is halved) through the scaling signal A2, as illustrated in the left side array of FIG. 4, practically avoiding any perturbation of the j selected generators of the upper subset, presently contributing to the analog output current.

The next incoming signal code INSIN pertaining to the sampling period $t_1$ will be multiplied by the same factor x, for example by 2, and simultaneously, besides multiplying by 2 also the errors stored in the work memory of the noise shaping circuit NSH, the index i pointing to the first of the j adjacent elementary current generators, as selected by the THERMOMETRIC CODE CONVERSION circuit, is forced to the value N/2−1 by the command S of the DYRO CONTROL UNIT.

Therefore, in the sampling period $t_1$, the selection of a multiplied number j of elementary current generators will occur through the bus C2, among the eight elementary current generators belonging to the lower subset that had already been coordinately scaled during the preceding sampling period $t_0$, while the remaining eight elementary current generators belonging to the upper subset will also be scaled by the signal A1 during this sampling period $t_1$, as illustrated in the central array of FIG. 4.

The following table resumes the timing coordination among the different actions during a switch-on phase of the "compander" function in the considered DAC by indicating respective functional values of the various commands:

| | | | | | | | |
|---|---|---|---|---|---|---|---|
| $t_{-1}$ : | G = 1 | G' = 1 | G" = 1 | B = 1 | A2 = 1 | A1 = 1 | S = normal scrambling |
| $t_0$ : | G = 2 | G' = 1 | G" = 1 | B = 1 | A2 = 0.5 | A1 = 1 | S = scaling of lower subset |
| $t_1$ : | G = 2 | G' = 2 | G" = 1 | B = 2 | A2 = 0.5 | A1 = 0.5 | S = scaling of upper subset |
| $t_2$ : | G = 2 | G' = 2 | G" = 2 | B = 2 | A2 = 0.5 | A1 = 0.5 | S = normal scrambling |

After the two successive sampling periods $t_0+t_1$, the normal scrambling action of the CURRENT GENERATOR CONTROL circuit will resume, ceasing the momentary conditioning of the selection necessary for activating the "compander" function without introducing any artifact. In practice, a perfectly coordinated scaling of all sixteen elementary current generators is accomplished in just two sampling periods, $t_0$ and $t_1$, without introducing any artifact.

Thereafter and until the DYRO CONTROL UNIT will command the deactivation of the "compander" function, the normal operation of the scrambling circuit will not be forcibly altered, and the random selection of the decoded number (j) of output analog signal elementary contributions will be done among the whole set of the sixteen scaled current generators, as illustrated in the right side array of FIG. 4 pertaining to the sampling period $t_2$.

Of course, the opposite process is performed when the input signal amplitude returns to a relatively high value, that is the incoming sample code(s) rises to or surpasses the relative pre-established threshold value. The approach is useful even in other types of DACs, for example using a binary coding, in balanced as well as in single ended output DACs. In any case, at least two subsets of elementary sources are defined for allowing their respective scaling in two successive sampling periods, without affecting currently selected elementary sources that are delivering analog output signal contributions.

The multiplication command signal G and delayed replicas G' and G" may be logic signals of activation/deactivation of the relative multiplication or scaling functions by a preestablished factor or may be numerical expressions of the factor itself. Similarly, the selection conditioning signal S and the error values multiplication signal B may also be either logic enabling/disabling signals or numerical values (codes) expressing the multiplication factor and addend, respectively, as will be understood by one of skill in the art.

The circuit provides an effective approach to the above-discussed problem by allowing an increase of the dynamic range of the DAC of up to about 20 db compared to the same DAC without the dynamic range optimizing circuit. This result is achieved without necessarily using components of extremely precise matching and with a substantially low increase of die area of integration.

Because of the ability of scaling all elementary current sources by the same factor of multiplication of the incoming sample code in just sampling periods without affecting the elementary current generators being currently used for digital-to-analog conversion, there are no sensible artifacts produced on the output signal by the on-off switching of the "compander" function.

That which is claimed:

1. A method for enhancing a dynamic range of a digital-to-analog converter (DAC), the DAC including at least first and second subsets of individually selectable elementary current sources for delivering analog output current contributions, and a code conversion circuit for selecting elementary current sources as a function of incoming codes of a pulse code modulated (PCM) input signal, the method comprising:

multiplying by a certain factor incoming codes of the PCM input signal after their value has remained lower than a first threshold for a certain period and for as long as their value equals or surpasses a second threshold; and correspondingly scaling and de-scaling by the certain factor an amplitude of the analog output current contributions produced by the elementary current sources.

2. The method of claim 1, wherein the DAC is of a thermometric type and the elementary current sources produce current contributions nominally equal in absolute value.

3. The method of claim 1, wherein the scaling of the elementary current sources is accomplished in two successive sampling periods as follows:

for the elementary current sources of the first subset the scaling occurs during a first sampling period while selected elementary sources belonging to the second subset are delivering output current contributions;

for the elementary current sources of the second subset the scaling occurs during the successive sampling period while selected elementary sources belonging to the first subset, previously scaled, are delivering output current contributions.

4. The method of claim 1, wherein the DAC further includes an input interpolator followed by a noise shaping circuit using error values stored in a work memory for reducing a number of bits of encoding upstream of the code conversion circuit; and wherein the incoming codes multiplied by the certain factor are of the interpolated PCM signal being input to the noise shaping circuit and error values used by the noise shaping circuit are coordinately multiplied by the certain factor.

5. The method of claim 1, wherein the DAC is a component of an audio system.

6. A method for enhancing a dynamic range of a digital-to-analog converter (DAC) of an audio system, the DAC including at least first and second subsets of individually selectable elementary current sources for delivering analog output current contributions, and a code conversion circuit for selecting elementary current sources as a function of a value of incoming codes of a pulse code modulated (PCM) input signal, the DAC being of a thermometric type and the elementary current sources producing current contributions nominally equal in absolute value, the method comprising:

multiplying by a certain factor incoming codes of the PCM input signal after their value has remained lower than a first threshold for a certain period of time and for as long as their value equals or surpasses a second threshold; and correspondingly scaling and de-scaling by the certain factor the amplitude of the analog output current contributions produced by the elementary current sources.

7. The method of claim 6, wherein the scaling of the elementary current sources is accomplished in two successive sampling periods as follows:

for the elementary current sources of the first subset the scaling occurs during a first sampling period while selected elementary sources belonging to the second subset are delivering output current contributions;

for the elementary current sources of the second subset the scaling occurs during the successive sampling period while selected elementary sources belonging to the first subset, previously scaled, are delivering output current contributions.

8. The method of claim 6, wherein the audio system further includes an input interpolator followed by a noise shaping circuit using error values stored in a. work memory for reducing a number of bits of encoding upstream of the DAC; and wherein the incoming codes multiplied by the certain factor are of the interpolated PCM signal being input to the noise shaping circuit and error values used by the noise shaping circuit are coordinately multiplied by the certain factor.

9. A digital-to-analog converter (DAC) comprising:

at least first and second subsets of individually selectable elementary current sources for delivering analog output current contributions;

a code conversion circuit for selecting elementary current sources of said at least first and second subsets of individually selectable elementary current sources as a function of incoming codes of a pulse code modulated (PCM) input signal;

a logic circuit monitoring the incoming codes for activating, at the start of a first sampling period, after they have remained lower than a first threshold for a certain period and for as long as their value equals or surpasses a second threshold, a first conditioning command for conditioning during a same sampling period selection of a decoded number of contributory elementary current sources among those of said first subset, and for activating a second multiplication command;

a circuit receiving the second multiplication command for scaling by a certain factor, when the second multiplication command is active, an amplitude of analog output current contributions produced by the elementary current sources of the second subset deselected during the first sampling period by the first conditioning command; and a circuit receiving a replica delayed by a sampling period of the second multiplication command, for multiplying by a correspondent factor the incoming codes to be fed to said code conversion circuit and for scaling by the certain factor an amplitude of analog output current contributions of elementary current sources of said first subset, deselected during the sampling period following the first sampling period by the first conditioning command.

10. The DAC of claim 9, wherein the elementary sources of said first subset contribute a positive current and the elementary sources of said second subset contribute a negative current.

11. The DAC of claim 9, wherein said code conversion circuit is of thermometric type and said elementary current sources produce current contributions nominally equal in absolute value.

12. The DAC of claim 9, further comprising a work memory, a noise shaping circuit, and an input interpolator followed by said noise shaping circuit using error values stored in said work memory for reducing the number of bits of encoding, upstream of said code conversion circuit; and wherein the incoming codes multiplied by the certain factor are of the interpolated PCM signal before being fed to said noise shaping circuit and said error values stored in said work memory are coordinately multiplied by the certain factor by a multiplication command output by said circuit receiving the first delayed replica of said second multiplication command and a second replica of said second multiplication command delayed by two sampling periods.

13. A digital-to-analog converter (DAC) comprising:

at least first and second subsets of individually selectable elementary current sources for delivering analog output current contributions;

a code conversion circuit for selecting elementary current sources as a function of incoming codes of a pulse code modulated (PCM) input signal;

a circuit multiplying by a certain factor incoming codes of the PCM input signal after their value has remained lower than a first threshold for a certain period and for as long as their value equals or surpasses a second threshold, and correspondingly scaling and de-scaling by the certain factor an amplitude of the analog output current contributions produced by the elementary current sources.

14. The DAC of claim 13, wherein the elementary current sources produce current contributions nominally equal in absolute value.

15. The DAC of claim 13, wherein the scaling of the elementary current sources is accomplished in two successive sampling periods as follows:
- for the elementary current sources of the first subset the scaling occurs during a first sampling period while selected elementary sources belonging to the second subset are delivering output current contributions;
- for the elementary current sources of the second subset the scaling occurs during the successive sampling period while selected elementary sources belonging to the first subset, previously scaled, are delivering output current contributions.

16. The DAC of claim 13, further comprising a work memory, a noise shaping circuit, and an input interpolator followed by said noise shaping circuit using error values stored in said work memory for reducing the number of bits of encoding, upstream of said code conversion circuit.

* * * * *

UNITED STATES PATENT AND TRADEMARK OFFICE
CERTIFICATE OF CORRECTION

PATENT NO. : 7,239,258 B2  Page 1 of 1
APPLICATION NO. : 11/352104
DATED : July 3, 2007
INVENTOR(S) : Grosso et al.

It is certified that error appears in the above-identified patent and that said Letters Patent is hereby corrected as shown below:

Cover page -      Delete: "Oct. 3, 1005."
OTHER      Insert: -- Oct. 3, 2005 --
PUBLICATIONS Delete: "a.work"
Column 9, Line 57      Insert: -- a work --

Signed and Sealed this

Second Day of September, 2008

JON W. DUDAS
*Director of the United States Patent and Trademark Office*